US005886304A

United States Patent [19]
Schlenzig et al.

[11] Patent Number: 5,886,304
[45] Date of Patent: Mar. 23, 1999

[54] OMNI-DIRECTIONAL SOUND SYSTEM

[76] Inventors: Dieter Schlenzig, Höhenstr. 4, 65510 Hünstetten-Limbach; Thomas Apfel, Kurtrierer Weg 9, 61267 Neu-Anspach, both of Germany

[21] Appl. No.: 802,873

[22] Filed: Feb. 19, 1997

[30] Foreign Application Priority Data

Feb. 20, 1996 [DE] Germany ........................ 296 02 961 U

[51] Int. Cl.$^{6}$ ........................................................ H05K 5/00
[52] U.S. Cl. ........................... 181/155; 181/156; 181/153
[58] Field of Search ..................................... 181/148, 152, 181/153, 155, 156, 196, 199; 381/90, 154, 158, 160

[56] References Cited

U.S. PATENT DOCUMENTS

| | | | |
|---|---|---|---|
| 4,348,549 | 9/1982 | Berlant | 181/155 |
| 4,580,654 | 4/1986 | Hale . | |
| 5,105,905 | 4/1992 | Rice . | |
| 5,721,401 | 1/1998 | Sim | 181/156 |

FOREIGN PATENT DOCUMENTS

| | | |
|---|---|---|
| 2184323 | 6/1987 | United Kingdom . |

*Primary Examiner*—Khanh Dang
*Attorney, Agent, or Firm*—Barnes, Kisselle, Raisch, Choate, Whittemore & Hulbert, P.C.

[57] ABSTRACT

In an omni-directional sound system such as a sound-light combination arrangement having at least one loudspeaker and optionally at least one light source, a bass loudspeaker arrangement includes a cylindrical casing having end walls at which are installed a bass loudspeaker and an insert casing respectively. The insert casing forms one or more bass reflection spaces within the casing. A sound deflection cone is arranged with its tip opposite the bass loudspeaker.

6 Claims, 8 Drawing Sheets

OMNI-DIRECTIONAL SOUND SYSTEM

FIELD OF THE INVENTION

The invention concerns an omni-directional sound system for example in the form of a sound-light combination arrangement.

BACKGROUND OF THE INVENTION

The combination of one or more loudspeakers or a loudspeaker box with one or more light sources is already Known (DE 32 16 190). In that assembly the loudspeakers are surrounded by the light sources which are in the form of incandescent lamps or fluorescent tubes while extending around the light sources is a light or lamp shield or shade. The sound pressure is very considerably directionally dependent, by virtue of the loudspeaker arrangement, in other words, it is not possible to produce an omni-directional sound image. This therefore does not involve an omni-directional sound system.

Large numbers of combinations of loudspeakers and light sources in various forms are also to be found in DE-U 76 00 002; 80 09 6821 82 29 621; 81 37 079, 81 37 276; and 85 25 736: DE-A 31 49 574, and 41 04 481: and EP-A 0 153 515. Those publications propose all possible arrangements, but not a single one involves an omni-directional sound system in which the sound can be irradiated uniformly in all directions in space.

Loudspeaker boxes using cones as reflection bodies are known per se, as can be seen from DE-U 85 29 497, EP-A 0 320 270 and U.S. Pat. No. 5,115,882. Such configurations however do not provide a light-sound combination arrangement.

SUMMARY OF THE INVENTION

An object of the present invention is to provide an omni-directional sound system in which the distribution or diffusion of sound can be effected in a controlled manner.

Another object of the present invention is to provide an omni-directional sound system which permits at least substantially uniform distribution of the sound produced in all directions, in a specifically controlled fashion.

In accordance with the present invention the foregoing and other objects are achieved by an omni-directional sound system comprising a control unit for actuating different loudspeaker means, including a bass loudspeaker means which includes a cylindrical casing with a first radial surface, a second radial surface and a peripheral wall, a bass loudspeaker installed in the first radial surface, a first sound deflection means having a sound deflection cone which is arranged with its tip opposite the bass loudspeaker, an installation casing which is installed in the second radial surface and which is provided with at least one sound outlet opening, and a second sound deflection means arranged at the intended spacing relative to the at least one sound outlet opening.

In the case of a light-sound combination arrangement, use it made of a casing having a perpendicular axis, in which the components of the system are suitably installed. The loudspeaker or loudspeakers each have a sound radiation axis which is oriented parallel to or coincident with the axis of the casing. Associated with each loudspeaker is a sound deflection cone having a tip which is oriented towards the loudspeaker, more specifically with coincident axes if the sound in to be uniformly distributed in all directions, or in slightly displaced relationship if a preferential range in respect of the propagation of sound is wanted. The common casing also has at least one transparent wall region, behind which is disposed at least one light source.

That configuration can thus provide a sound-light combination arrangement which can be designed in the manner of ceiling lamps or standard lamps in order to serve on the one hand for lighting purposes and on the other hand as a sound unit for producing for example music.

The omni-directional sound system may also include a plurality of loudspeaker boxes which can be arranged suitably distributed in the listening space or area and which can be suitably actuated and controlled by way of a control assembly.

Further objects, features and advantages of the invention will be apparent from the following description of preferred embodiments of the invention.

DESCRIPTION OF PREFERRED EMBODIMENTS

Figure 1:
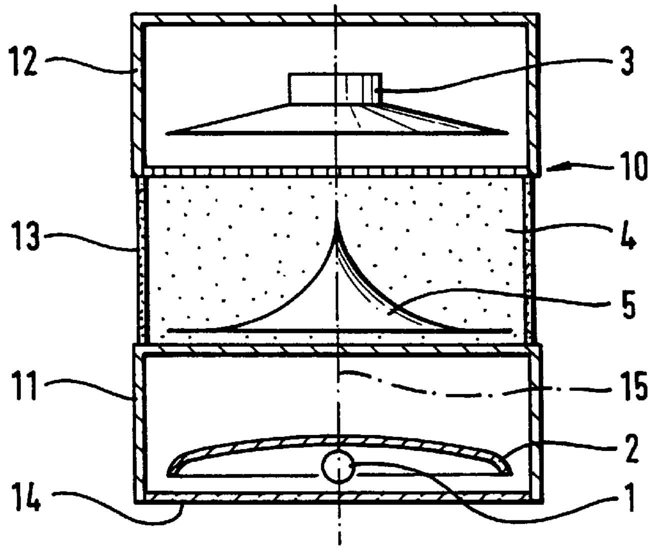
FIG. 1 shows a first embodiment of a sound-light combination arrangement in the form of a ceiling lamp.

Reference is firstly made to FIG. 1. As can be seen therefrom an omni-directional sound system includes a common casing 10 comprising first, second and third portions 11, 12 and 13 disposed in vertically superposed relationship. Arranged within the casing portion 11 are a light source diagrammatically indicated at 1 and a light reflector 2. A transparent plate 14 is disposed at least at the underside of the casing portion 11. The light source 1 can comprise a single incandescent lamp, and in this case it is arranged coincident with the axis of the system as indicated at 15. If a plurality of elements are used to form the light source, they are arranged suitably symmetrically or in a distributed array around the axis 15 of the system, according to the desired pattern.

The casing portion 12 houses a loudspeaker 3 whose sound radiation axis is coincident with the axis 15 of the system. Disposed in the casing portion 13 is a sound deflection cone 5 whose tip or point faces towards the loudspeaker 3. The sound deflection cone 5 cart be surrounded by sound-transmissive material 4. In the illustrated embodiment the axis of the cone 5 coincides with the axis 15 of the system, whereby sound radiation and distribution is uniformly omni-directional. However, by slight displacement of the sound deflection cone 5 relative to the axis 15 of the systen it is possible to achieve controlled and specific asymmetry of the otherwise omni-directional propagation of sound if that is wanted for certain spatial sound effects.

It will be appreciated that the casing 10 is only diagrammatically illustrated and it will be further noted that it can be fixed to a ceiling by suitable holders in order to provide a ceiling lamp or it can be equipped with suitable logs or feet to form a standing lamp.

Figure 2:
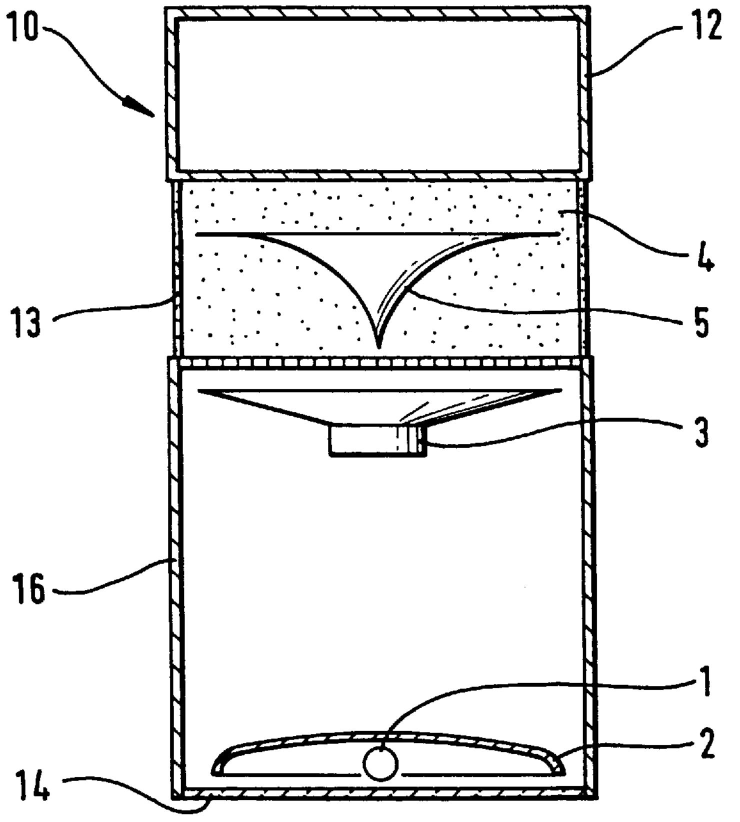
FIG. 2 shows a second embodiment of the sound-light combination arrangement.

Reference will now be made to FIG. 2 showing a modified form of the combination arrangement. The casing 10 in this case has a lower casing portion 16 of increased size, which accommodates both the light source 1 with the light reflector 2 and also the loudspeaker 3. The sound deflection cone 5 is arranged with its tip directed downwardly towards the loudspeaker 3. The upper casing portion 12 is empty or is reserved for accommodating parts of the system, as are required for supplying power to and actuating sound and light generating units.

Figure 3:
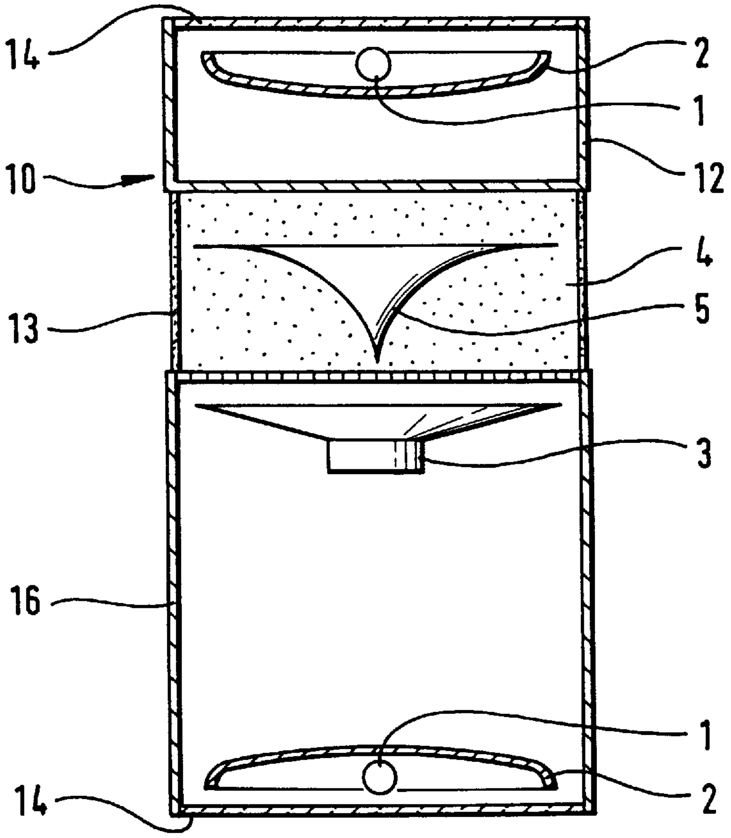
FIG. 3 shows a third embodiment.

Referring now to FIG. 3, shown therein is the combination arrangement of FIG. 2 when a light source 1 is also disposed in the casing portion 12. The light reflector 2 concentrates the light in an upward direction, a transparent or translucent plate 14 being provided above the reflector 2 and the light source 1. The same arrangement its to be found at the underside of the unit in FIG. 3.

Figure 4:
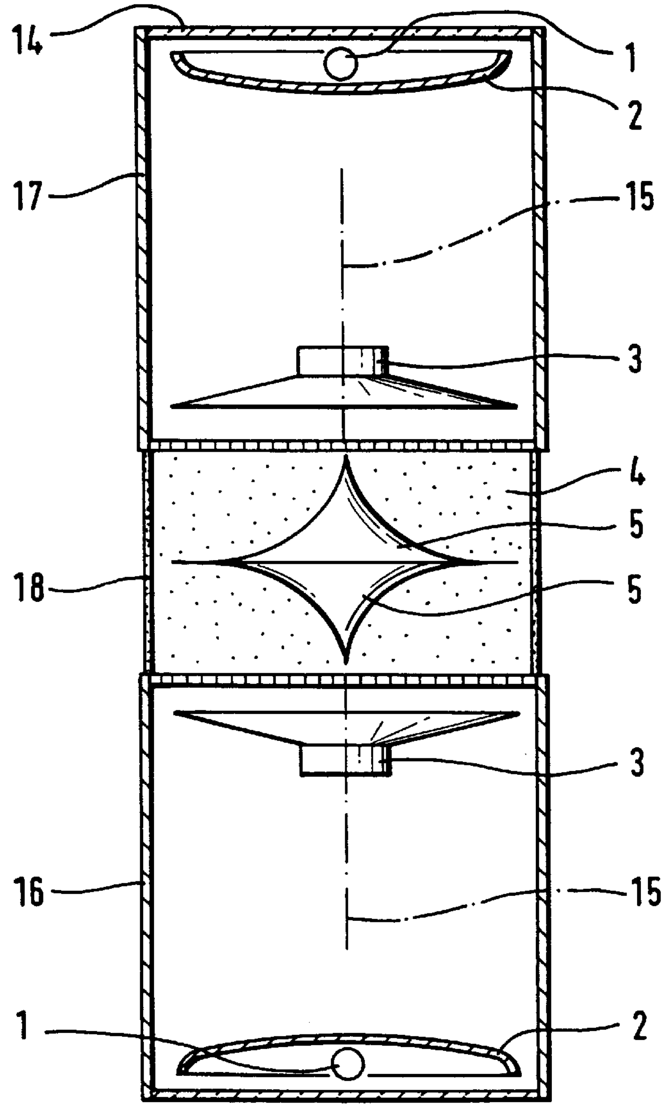
FIG. 4 shows a fourth embodiment of the combination arrangement.

FIG. 4 shows an embodiment or the combination arrangement, in which the upper casing portion 17 is of a similar configuration to the lower casing portion 16, as described above with reference to FIG. 2, but it is oriented in the reverse direction, in other words the light source 1 emits light upwardly and the loudspeaker 2 emits sound downwardly. Provided in the central casing portion 18 are first and second sound deflection cones 5 which are directed with their respective tips upwardly and downwardly towards the respectively associated loudspeakers 3. The loudspeakers 3 and the sound cones 5 are each arranged symmetrically with respect to the axis 15 of the arrangment if a uniform all-around sound is to be generated. By slightly displacing the sound cones 5 however it is also possible to achieve a slight degree of asymmetry in the all-round propagation of sound. While the loudspeakers 3 at top had bottom are shown as being of equal size, they may be of different types and sizes, for example they may be tweeters and woofers respectively, as required.

Instead of the light being propagated in an upward and a downward direction it is also possible to provide for lateral propagation of the light, a situation which can be considered in particular when a plurality of the illustrated casings are arranged in mutually superposed relationship. In that way it is possible to produce sound-light column constructions which combine a high degree of aesthetic attraction with excellent sound reproduction of music. It will be appreciated that in that respect the choice of this loudspeakers is matched to the frequency range or spectrum to be covered.

As combination elements for the above-mentioned sound-light column structure it is also possible to use casings with the casing portions 12, 13 or 12, 16 (without the lamp 1) respectively if otherwise casing portions with at least one lamp are incorporated in the combination arrangement. In that case the portion 16 can be provided with a subwoofer for the bass frequency range.

Active or passive systems can be used as the loudspeakers, with hi-fi quality being preferred.

The sound deflection cones do not need to be of the illustrated envelope curve shape, but other cone shapes can also be envisaged.

Besides the illustrated cylindrical casing shapes it is also possible to consider using other shapes and in particular open forms of casing which can be afforded by the adoption of frame structures and the like.

The combination arrangement may also include a control unit for the light sources or lighting means in order to operate them in various operating modes, including continuous lighting, flashing lighting, projected light or floodlight, superimposed light phenomena to provide for example a light organ effect and the like. In that sense the control unit may also have a light control computer.

Light sources and lighting means may also be disposed within the sound deflection cones which are then at least partially transparent. Additional lighting affects can then be achieved with deflection cones of that kind.

Figure 5:
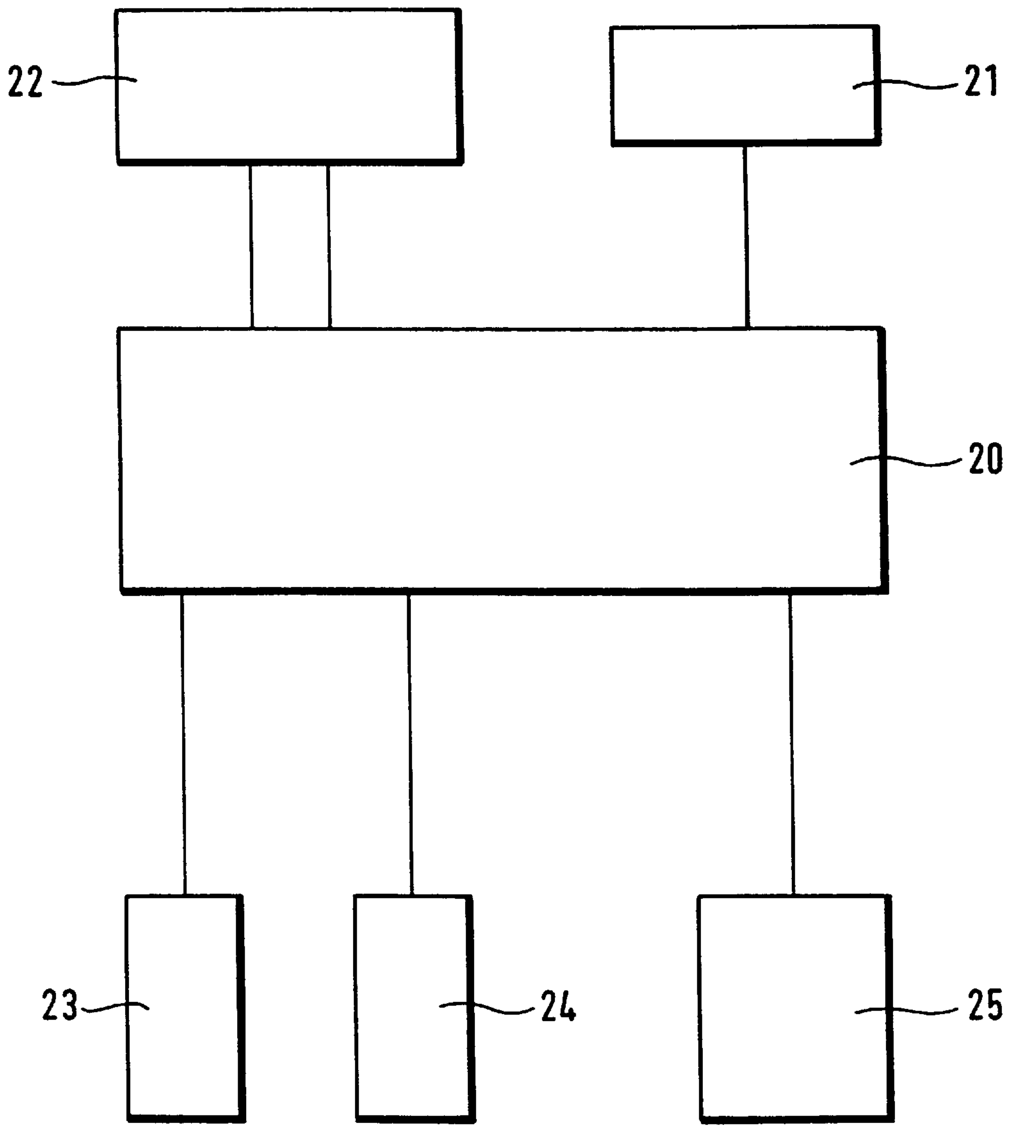
FIG. 5 is a diagrammatic view of a sound system.

FIG. 5 is a diagrammatic view of an omni-directional sound system according to the invention. The system has a control unit as indicated at 20 which is connected to a current mains unit 21 for the supply of current to the control unit 20, and to the output lines of an amplifier 22, for distributing the received electrical signals to loudspeaker units 23, 24 and 25 respectively. The loudspeaker units 23 and 24 represent satellite loudspeakers 1 and 2 respectively while the loudspeaker group 25 forms a subwoofer.

Figure 6:
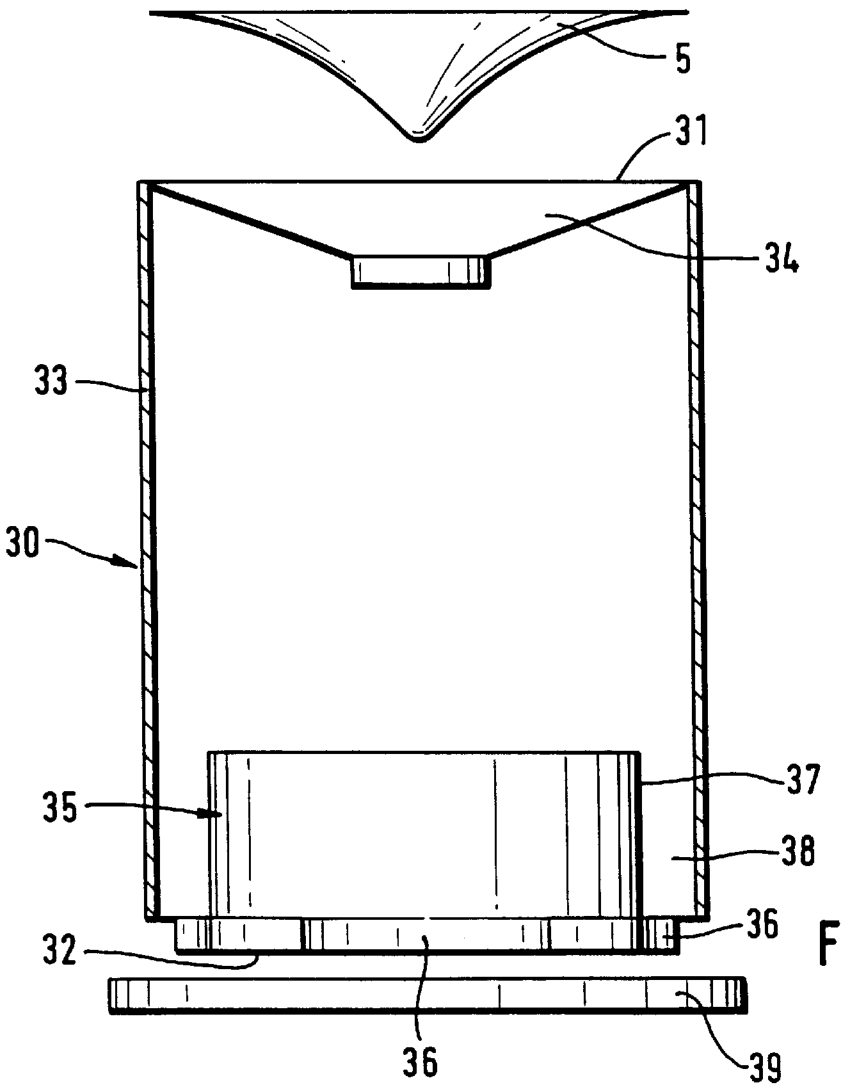
FIGS. 6 and 6*a* show a bass loudspeaker.
Figure 6A:
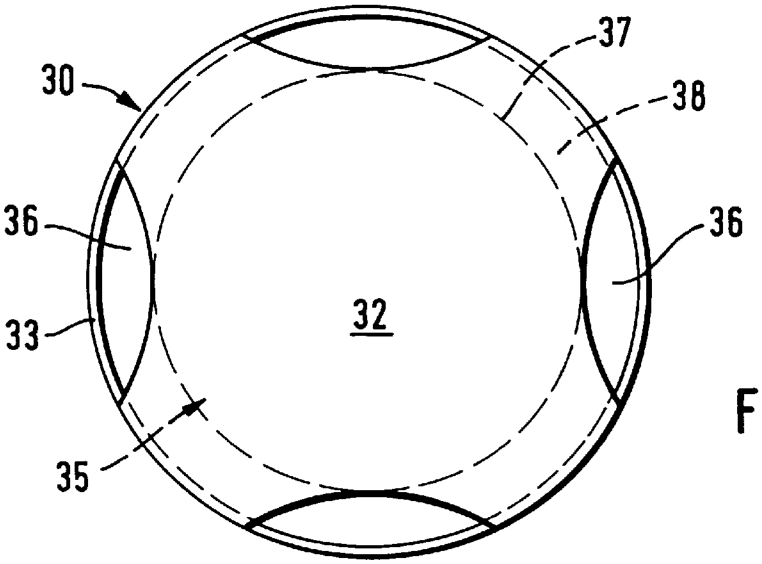

FIG. 6 diagrammatically illustrates a subwoofer 25 of that kind, with FIG. 6*a* being a plan view. The subwoofer 25 comprises a cylindrical casing 30 with an upper radial surface 31, a lower radial surface 32 and a cylindrical peripheral wall 33. A bass loudspeaker 34 is disposed in the upper radial wall 31, in symmetrical relationship with the casing 30, An insert 35 is fitted into the underside of the cylindrical casing of the arrangement. Disposed opposite the bass loudspeaker 31 is a sound deflection cone 5 having its tip facing downwardly towards the loudspeaker 31. A sound deflection plate 39 is arranged at a predetermined spacing relative to the underside 32 of the casing 30. The underside 32 of the casing 30 has a number of openings shown in the form of recesses 36 of part-circular cross-section in plan view, which are arranged symmetrically with respect to the axis of the arrangement, as shown in FIG. 6*a*. The insert casing 35 has a cylindrical portion 37 which is disposed at a radial spacing relative to the wall of the casing 30 to form an annular sound space 38 which is communicated with the exterior by way of the recesses 36 in the bass plate at 32. Sound energy which is irradiated from the rear of the loudspeaker 34 into the interior of the casing 30 is in that way also usefully emitted into the external space, while the frequency response characteristic of the loudspeaker can be influenced by way of the height of the insert casing 35.

Figure 7:
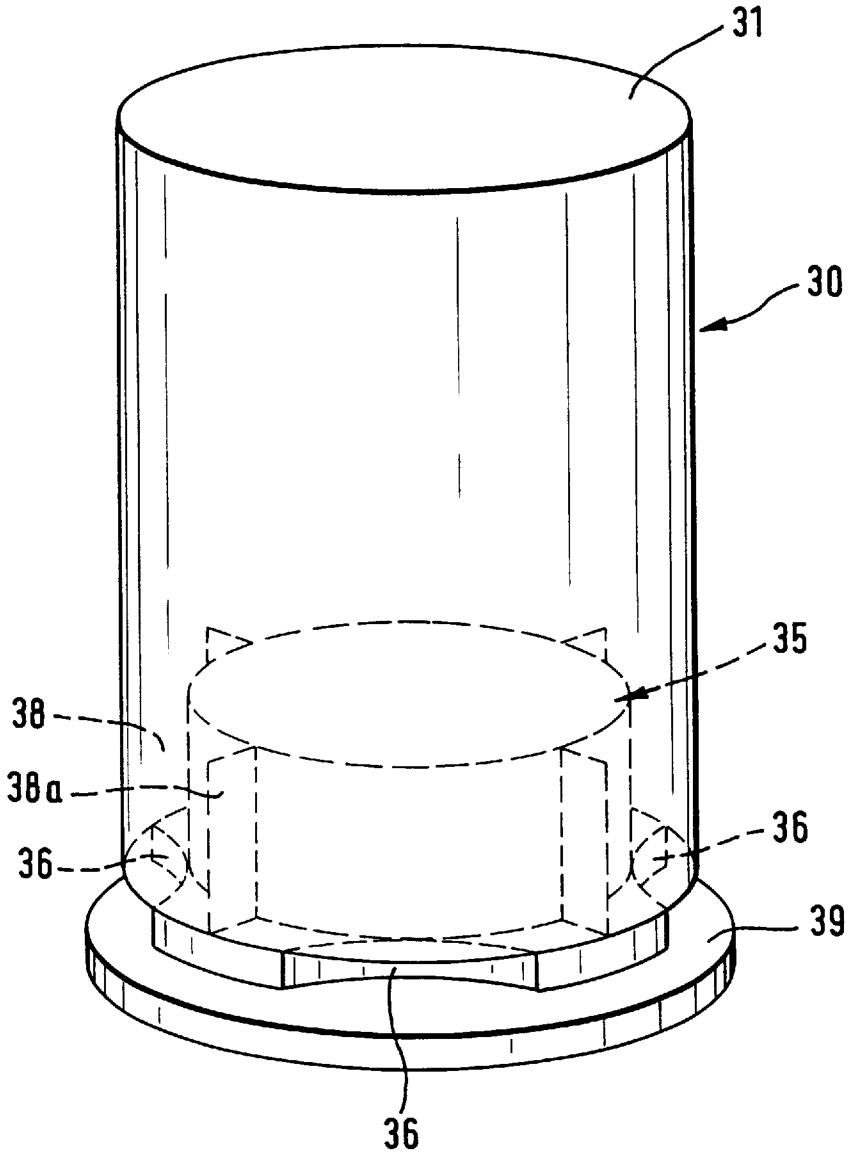
FIG. 7 shows a detail of the bass loudspeaker of FIG. 6, FIGS. 8 and 8*a* show a bass loudspeaker with light source.

FIG. 7 is a perspective view of the cylindrical casing 30 and the insert caning 35 shown in FIG. 6, but without having regard to the thickness of the walls of the casing. The annularly extending sound space 38 can be subdivided by a plurality of at least substantially radially extending ribs 38*a* into individual sectors which are each associated with a respective one of the outlet openings 36.

Figure 8:
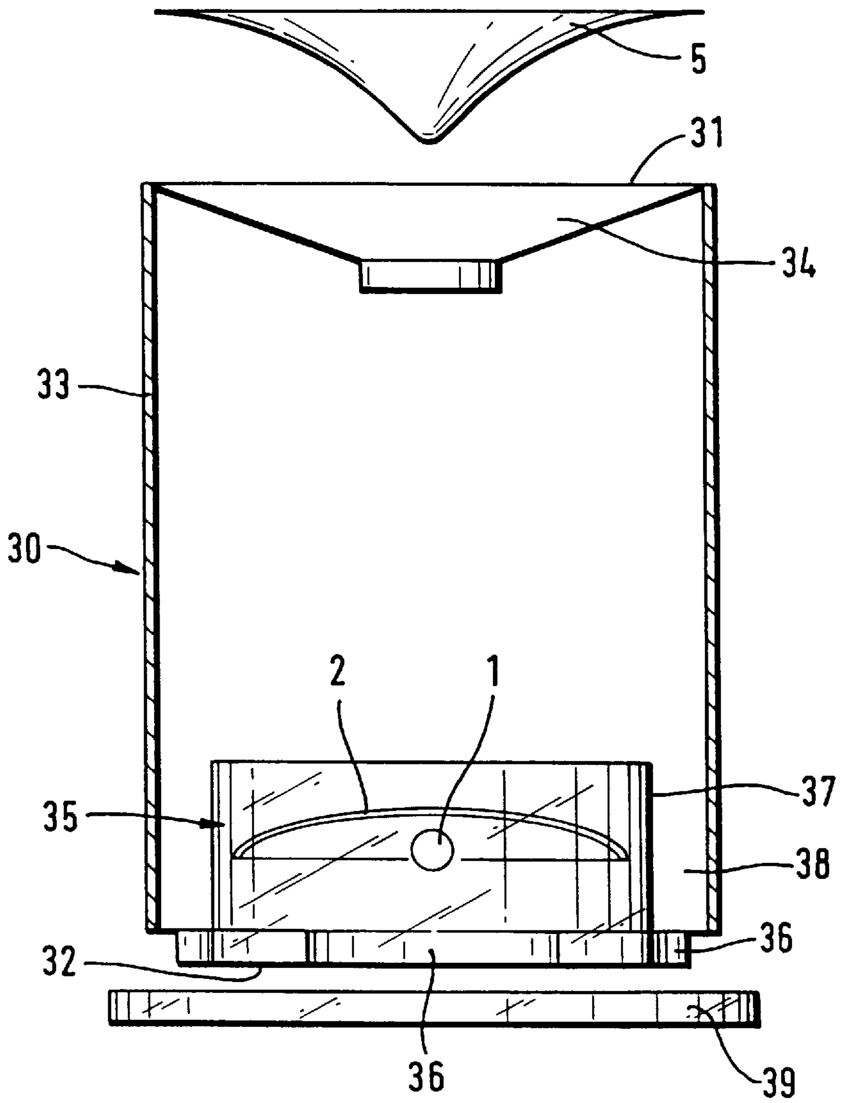
Figure 8A:
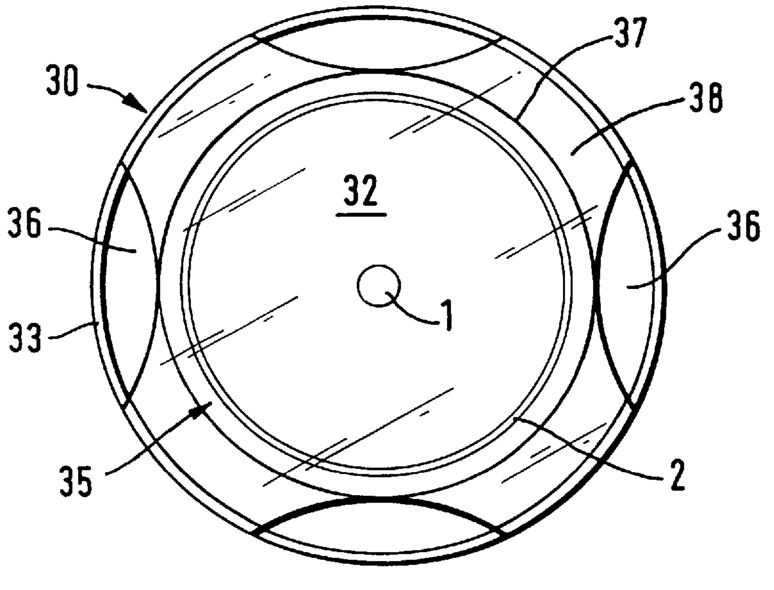

FIGS. 8 and 8*a* show the same bass loudspeaker arrangement as shown in FIGS. 6 and 6*a*, but incorporating a light source 1 and a light reflector 2 which are disposed in the interior of the insert casing 35. Accordingly the insert casing 35 and the plate 39 at the bottom of the arrangement are mads from transparent or translucent material in order to allow the light to appear therethrough and to give the desired lighting effects.

Figure 9:
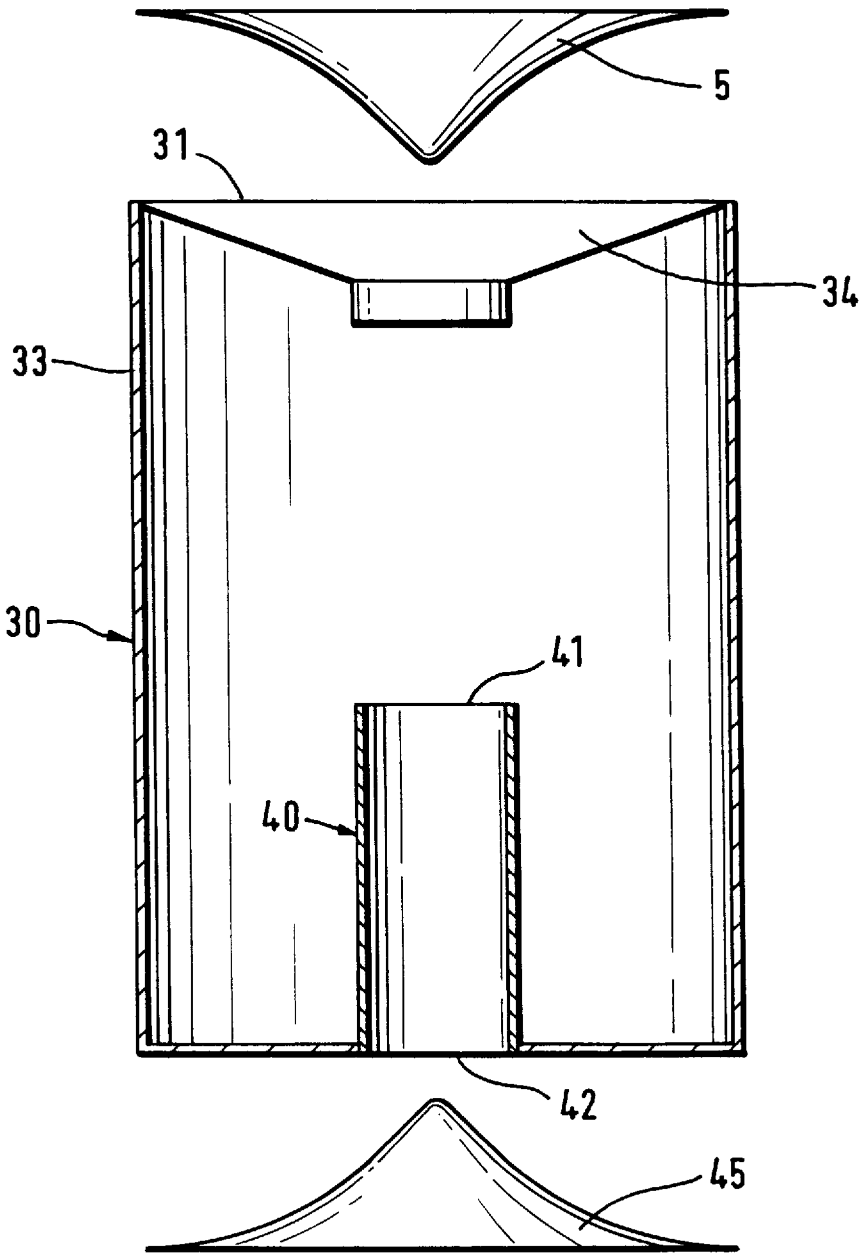
FIG. 9 shows a further bass loudspeaker.

FIG. 9 shows a modification of the bass loudspeaker arrangement. Arranged symmetrically with respect to the axis of symmetry of the casing 30 is a bass reflection tube 40 whose upper and lower ends as indicated at 41 and 42 are open. It will be seen that disposed opposite the bass loudspeaker 34 at the upper and of the arrangement is the downwardly facing tip of the sound deflection cone 5 while the tip of a sound deflection cone 45 at the lower end of the arrangement is disposed facing the bass reflection tube 40. With the choice of the length of the tube 40, it is for example possible advantageously to influence the frequency response characteristic of the bass loudspeaker 34.

Figure 10:
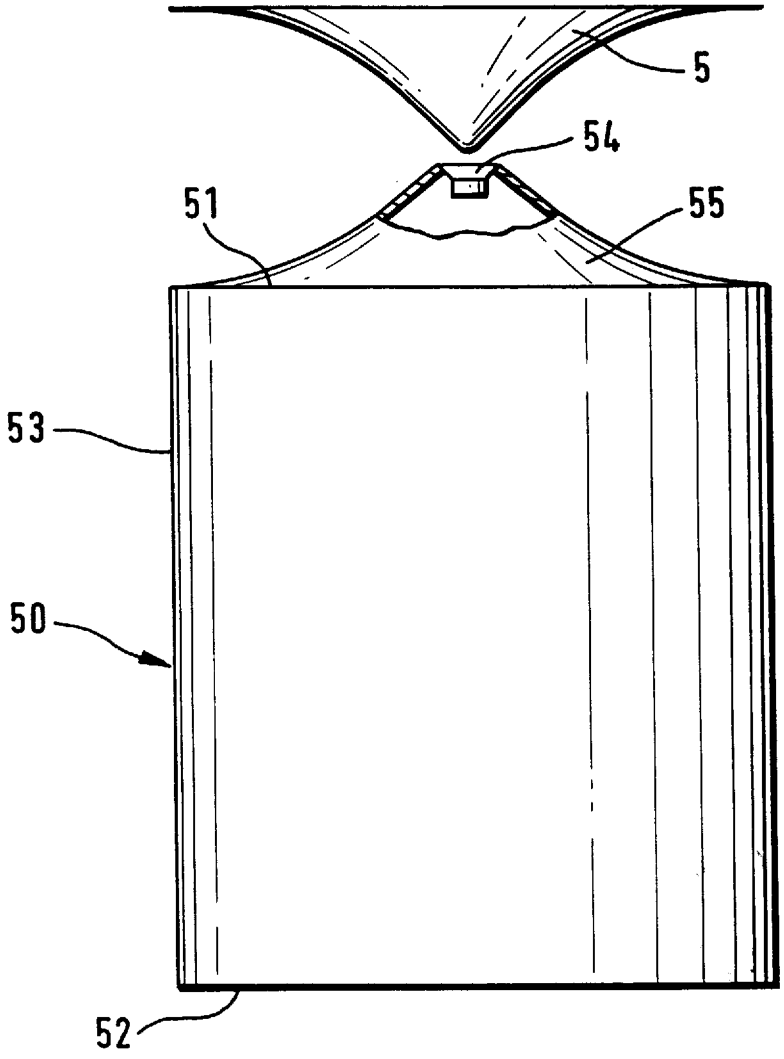
FIG. 10 shows a tweeter.

FIG. 10 shows a tweeter loudspeaker arrangement comprising a casing 50 having an upper end 51 and a lower end 52 and a cylindrical peripheral wall 53. Mounted to the flattened tip of an upwardly pointing cone 55 is an exponential tweeter 54 which is directed towards the downwardly pointing tip of a sound deflection cone 5 disposed above the casing 50. The interior of the casing 50 can be utilized for purposes as have been described hereinbefore with reference to FIGS. 1 through 4.

It will be appreciated that the above-described constructions and embodiments according to the present invention have been set forth solely by way of example and illustration of the principles of the invention and that various other modifications and alterations may be made therein without thereby departing from the spirit and scope of the invention.

What is claimed is:

1. An omni-directional sound system comprises:

a control unit adapted to actuate different loudspeakers, including a bass loudspeaker means; and the bass loudspeaker means including a cylindrical casing with a fist radial surface, a second radial surface and a peripheral wall, a bass loudspeaker connected to the first radial surface, a first sound deflection means including a sound deflection cone arranged with its tip opposite the bass loudspeaker, an insert casing connected to the second radial surface and provided with at least one sound outlet opening, and a second sound deflection means arranged at a spacing relative to the at least one sound outlet opening, wherein the insert casing forms with respect to the wall of the cylindrical casing an annular space which acts as a base reflection space, and symmetrically arranged sound radiation openings extending from said space.

2. A system as set forth in claim 1 wherein the insert casing is in the form of a bass reflection tube of predetermined length, which is open at both ends and which is arranged on the axis of the bass loudspeaker, and wherein the second sound deflection means is in the form of a second sound deflection cone having a tip directed towards the opening of the bass reflection tube.

3. A system as set forth in claim 1 wherein the sound radiation openings are in the form of recesses in a radial wall of the insert casing.

4. A system as set forth in claim 1 including rib means for subdividing the annular space to separate off individual bass reflection spaces each associated with a respective sound radiation opening.

5. A system as set forth in claim 1 wherein the insert casing is adapted in its interior to accommodate a light source.

6. A system as set forth in claim 1 wherein the loudspeakers actuable by the control unit include an exponential tweeter at the tip of a deflection cone and further including a further deflection cone having a tip opposite the tweeter.

* * * * *